United States Patent
Gondcharton et al.

(10) Patent No.: US 9,472,530 B2
(45) Date of Patent: Oct. 18, 2016

(54) METHOD FOR CARRYING OUT A CONDUCTIVE DIRECT METAL BONDING

(71) Applicant: COMMISSARIAT A L'ENERGIE ATOMIQUE ET AUX ENERGIES ALTERNATIVES, Paris (FR)

(72) Inventors: Paul Gondcharton, Grenoble (FR); Lamine Benaissa, Massy (FR); Bruno Imbert, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/768,886
(22) PCT Filed: Mar. 5, 2014
(86) PCT No.: PCT/FR2014/050504
§ 371 (c)(1),
(2) Date: Aug. 19, 2015
(87) PCT Pub. No.: WO2014/135802
PCT Pub. Date: Sep. 12, 2014

(65) Prior Publication Data
US 2015/0380383 A1 Dec. 31, 2015

(30) Foreign Application Priority Data
Mar. 5, 2013 (FR) .................................... 13 51976

(51) Int. Cl.
*H01L 23/52* (2006.01)
*H01L 21/00* (2006.01)
(Continued)

(52) U.S. Cl.
CPC ............. *H01L 24/89* (2013.01); *H01L 21/185* (2013.01); *H01L 21/187* (2013.01); *H01L 24/05* (2013.01);
(Continued)

(58) Field of Classification Search
CPC .......... H01L 2224/83894; H01L 2224/83895; H01L 2224/83948; H01L 21/185; H01L 21/187; H01L 25/0657
USPC ........ 257/762, 777, 778; 438/107, 108, 455, 438/456
See application file for complete search history.

(56) References Cited

U.S. PATENT DOCUMENTS

| 2004/0126994 A1* | 7/2004 | Reif ..................... H01L 23/5226 438/455 |
| 2004/0157407 A1* | 8/2004 | Tong ...................... B23K 20/02 438/455 |

(Continued)

OTHER PUBLICATIONS

Shigetou, A. et al., "Modified Diffusion Bonding for Both Cu and SiO2 at 150° C. in Ambient Air," 2010 Electronic Components and Technology Conference, pp. 872-877.
Jul. 25, 2014 International Search Report issued in International Patent Application No. PCT/FR2014/050504.

*Primary Examiner* — Matthew E Warren
(74) *Attorney, Agent, or Firm* — Oliff PLC

(57) ABSTRACT

A method includes a) Providing a first substrate covered by a metal layer and a second substrate covered by a metal layer, b) Bringing into direct contact the metal layers so as to form a bonding interface having metal material bridges separated by cavities which are fluidly connected to each other, d) Immersing the bonding interface in an oxidizing fluid so as to form a metal oxide which fills at least in part the cavities and metal/metal oxide/metal contact areas. A structure is also provided having a first substrate, a first metal layer, a second metal layer forming a bonding layer with the first metal layer, and a second substrate, the bonding interface having: metal material bridges separated by cavities, a metal oxide partially filling the cavities, and metal/metal oxide/metal contact areas.

18 Claims, 2 Drawing Sheets

(51) Int. Cl.
*H01L 23/00* (2006.01)
*H01L 21/18* (2006.01)
*H01L 25/065* (2006.01)
*H01L 25/00* (2006.01)

(52) U.S. Cl.
CPC ............... *H01L 24/08* (2013.01); *H01L 24/80* (2013.01); *H01L 25/0657* (2013.01); *H01L 25/50* (2013.01); *H01L 2224/05647* (2013.01); *H01L 2224/08113* (2013.01); *H01L 2224/08145* (2013.01); *H01L 2224/08501* (2013.01); *H01L 2224/80203* (2013.01); *H01L 2224/80895* (2013.01); *H01L 2224/83894* (2013.01); *H01L 2224/83948* (2013.01)

(56) References Cited

U.S. PATENT DOCUMENTS

| | | | |
|---|---|---|---|
| 2005/0003650 | A1 | 1/2005 | Ramanathan et al. |
| 2005/0212111 | A1* | 9/2005 | Terazaki ............. B81C 1/00119 257/686 |
| 2009/0183825 | A1 | 7/2009 | Sato et al. |
| 2009/0286382 | A1* | 11/2009 | Huff .......................... C23F 4/00 438/455 |
| 2010/0190298 | A1 | 7/2010 | Kuramoto et al. |
| 2012/0119359 | A1* | 5/2012 | Im ..................... H01L 23/49811 257/737 |
| 2013/0153093 | A1* | 6/2013 | Vandroux ......... H01L 21/02068 148/525 |

\* cited by examiner

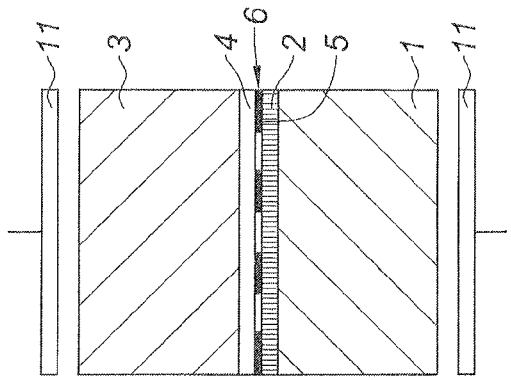
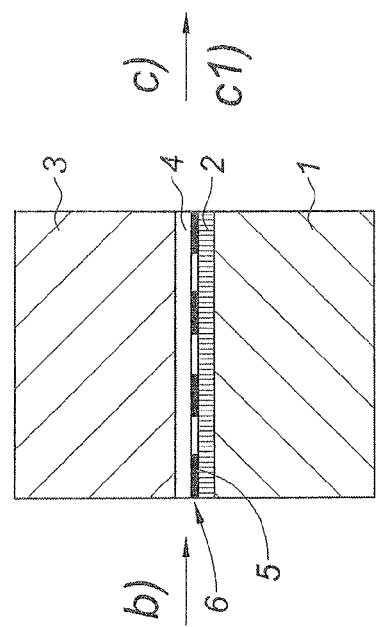
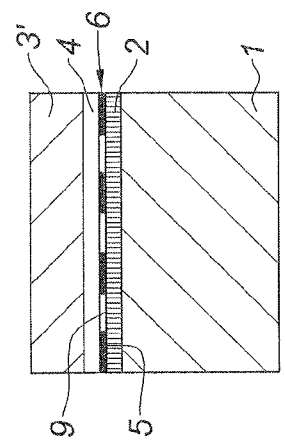
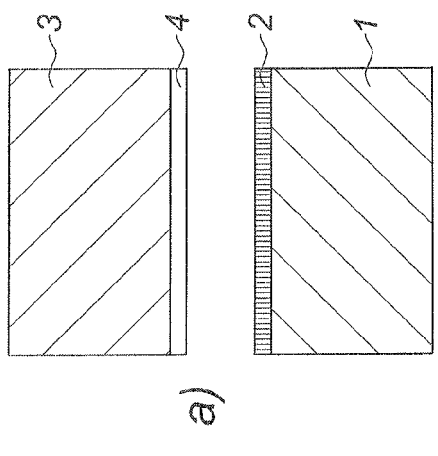
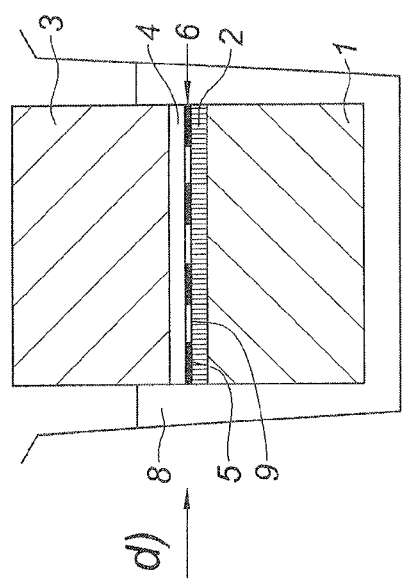

METHOD FOR CARRYING OUT A CONDUCTIVE DIRECT METAL BONDING

The present invention concerns a method for carrying out a conductive direct metal bonding between two semi-conductive substrates. The invention also concerns a structure presenting two semi-conductive substrates assembled by a conductive direct metal bonding.

Several known techniques of conductive bonding which are likely to assemble substrates bring into direct contact metals deposited on one face of the substrates, without introducing intermediate compounds, such as an adhesive, a glue . . . , at the interface.

As example, the method of direct bonding of copper without thermo-compression consists in bringing into contact, generally at ambient temperature, smooth surfaces, namely surfaces presenting a RMS roughness smaller than or equal to 0.5 nm, hydrophilic (that is to say, presenting a water drop angle typically smaller than or equal to 20°) and devoid of contamination. Afterwards, annealing may be applied to the structure in order to strengthen the quality of the bonding. Upon completion of this heat treatment, the bonding interface appears reconstructed and presents copper/copper contacts enabling, on the one hand, the electrical conduction, and on the other hand, a good mechanical resistance to thinning of at least one of the substrates which compose the structure.

This technique presents the drawback of being dependent on the condition of the surfaces before bonding. Therefore, the critical steps of this method consist of the mechano-chemical polishing and the activation of the surfaces, which are carried out on the deposited metal layers prior to bonding. However, on the one hand, mastering such processes varies from one metal to another, and on the other hand, a time constraint of the sequencing of the preparation and bonding steps is necessary to the success of such assemblies.

Other techniques of metal bonding of deposited layers are known, such as the methods of bonding copper assisted by thermo-compression. In this technique, an additional supply of energy is provided when bonding the substrates in heat and mechanical form by applying a pressure on either side of the assembly.

This technique has the advantage of limiting the constraints in terms of preliminary surface preparations and particularly in terms of smoothing (feasibility up to 8.6 nm RMS). However, the method temperatures leading to the reconstruction of the bonding interface are higher than or equal to 350° C. and may damage components present on the structure.

The main drawback that has been highlighted by the prior art related to this technique is the residual presence, after bonding, of defects at the interface, which appear in the form of voids (within the meaning of lack of solid material) limited by grain boundaries.

One of the aims of the invention consists in overcoming at least one of the aforementioned drawbacks. To this end, the invention proposes a method for carrying out a conductive direct metal bonding between two substrates of semi-conductive materials, comprising the steps consisting in:
  a) Providing a first substrate a surface of which is covered by a first metal layer and a second substrate a surface of which is covered by a second metal layer,
  b) Bringing into direct contact the first metal layer and the second metal layer so as to form a bonding interface comprising metal material bridges between the first metal layer and the second metal layer, the metal material bridges being separated by cavities which are fluidly connected together,
  d) Immersing the bonding interface in an oxidizing fluid so as to oxidize, at least in part, portions of the first metal layer and portions of the second metal layer which delimit the cavities, this oxidation generating a metal oxide which fills, at least in part, the cavities, the metal oxide forming contact areas between the portions of the first metal layer and the second metal layer which delimit the cavities.

In other words, the metal oxide is in direct contact with the metal of the first metal layer and the metal of the second metal layer. Thus, when implementing the method, the metal oxide that is formed at the bonding interface allows generating metal/oxide/metal contact areas at the cavities, thereby strengthening the bonding energy at the interface. It is then possible to apply mechanical operations on one of or on both substrates, in particular a mechanical thinning of one of the substrates without detachment of the bonding interface. Moreover, when the formed metal oxide is conductive or semi-conductive, the obtained bonding presents an electrical conduction better than that obtained by a conventional direct bonding between two metals having the considered roughnesses. Thus, the components that are formed on the structure show improved performances.

This technique has the advantage of limiting the constraints in terms of surface preparations in comparison with a conventional direct bonding technique, in particular in terms of smoothing and contamination. This avoids consuming a very large amount of material before achieving the desired roughness. Thus, with this method and without thermo-compression, the level of roughness for obtaining a bonding is of 0.7 nm RMS compared to 0.5 nm without oxidation at the bonding interface. It should be noted that, in the present document, all values of RMS roughness are AFM measurements for 20*20 micrometers fields. Similarly, the method of the invention allows reducing the requirement regarding the hydrophilic properties of the surface, which is very important in case of direct bonding without thermo-compression. Hence, the time constraint between the step of preparing the surfaces of the metal layers before bonding and the direct bonding itself is less important. Indeed, it is possible to keep the metal layers in a controlled atmosphere, for example under vacuum or in a nitrogen atmosphere, prior to bringing the surfaces into contact, without fearing a contamination or a change in the hydrophily of the surface. It is even possible, in case of a hot direct bonding, to keep the surfaces in the open air prior to bringing them into contact.

Preferably, the immersion step d) is carried out over a time period comprised between about 30 minutes and several hours so as to enable the penetration of the oxidizing fluid and the growth of the metal oxide in the cavities. Keeping the interface immersed during the oxidation allows avoiding withdrawal of the fluid, thereby allowing a homogenous oxidation at the edge and at the center of the substrates.

Advantageously, between steps b) and d), the method comprises a step c) of applying a thermal budget for annealing the bonding. By thermal budget it is meant the application of a temperature for a certain time. This thermal budget serves to strengthen the bonding energy.

Preferably, the application of the thermal budget according to step c) further comprises a step c1) of applying a pressure on either side of the bonding interface. This step, which consists in the combination of steps c) and c1), is a thermo-compression and allows improving the quality of the bonding interface and the quality of the formed metal material bridges prior to proceeding to the oxidation of the residual cavities. It allows assembling surfaces that present more significant roughnesses than in the absence of thermo-compression. For example, it is possible, in the context of the invention, to obtain a direct bonding with surfaces presenting a roughness of up to 50 nm RMS with oxidation and thermo-compression, compared to a roughness of less than 10 nm RMS with thermo-compression and without oxidation. The applied pressure depends on the condition of the surfaces to be bonded (in particular RMS roughness and hydrophily) and varies typically between 1 and 5 MPa. Thus, it would be possible to obtain a bonding between two surfaces which delimit cavities with a dimension up to about 100 nm in a direction substantially perpendicular to the bonding interface.

According to one possibility, prior to the contacting step b), the method comprises a step i) consisting in smoothing the surface of the first and second metal layers, in particular until obtaining a RMS roughness comprised between 0.1 and 0.7 nm. This surface preparation will make the direct bonding without thermo-compression possible. The benefit achieved from the controlled oxidation of the metal during the immersion step d) allows carrying out beforehand a direct bonding which is less dependent on the surface condition before bonding than for a conventional direct bonding where a roughness smaller than 0.5 nanometers RMS is necessary. For bondings with thermo-compression, it is possible to proceed without this smoothing step, and this up to RMS roughnesses in the order of 50 nm. Advantageously, the immersion step d) comprises heating the oxidizing fluid, in particular to a temperature comprised between about 10° C. and 100° C. This temperature allows accelerating the metal oxidation process.

According to one arrangement, subsequently to the immersion and oxidation step d), the method comprises a step e) of applying a heat treatment for strengthening the bonding. This step allows to further strengthen the bonding energy. As a result of the immersion step d), it is possible to reduce the bonding annealing thermal budget of step e) (that is to say, the annealing temperature and/or time period) for obtaining the same bonding energy. Reducing the temperature may allow to avoid damaging components that may be present on the substrates.

According to one arrangement, prior to step a) of providing a first substrate and a second substrate, the method comprises a step consisting in depositing by CVD (Chemical Vapor Deposition) the first metal layer and the second metal layer, respectively on said surface of the first substrate and on said surface of the second substrate.

According to one possibility, the deposition step is performed until reaching a thickness for the first metal layer and for the second metal layer comprised between 20 and 5000 nanometers and preferably a thickness comprised between 500 and 1000 nanometers.

Preferably, the first metal layer and the second metal layer are deposited on the substrates which are provided beforehand with a barrier layer presenting a thickness of few tens of nanometers, in particular formed of TiN. This layer serves to form a barrier to the diffusion of metal species of the metal layers in the substrates, in particular during the annealing steps. It may also serve as an adhesion layer for the deposition of the metal layers.

According to one possibility, the first and second substrates are chosen among the semi-conductive materials comprised among silicon, SiC, germanium, the alloys of elements III/V such as AsGa, InP, InGaN, AlGaN.

According to one variant, the first substrate comprises a semi-conductive material which is different from that of the second substrate.

Preferably, the oxidizing fluid comprises an oxidizing gas or an oxidizing liquid, in particular liquid water (H2O), hydrogen peroxide (H2O2) or gaseous HNO3.

Advantageously, the metal of the first metal layer and the metal of the second metal layer are chosen among copper, molybdenum, tungsten and their alloys. Indeed, these metals present a good electrical conductivity, and generate an oxide which is more voluminous than the unoxidized metal so that the cavities of the bonding interface are easily filled. Moreover, the use of some of these metals is advantageous in that they allow generating an oxide which is at least partially electrically conductive, and in that they are resistant to corrosion and present a coefficient of thermal expansion CTE close to that of the semi-conductive materials that are most commonly used in the industry.

According to one arrangement, the metal of the first metal layer is identical to the metal of the second layer. This allows the concomitant formation of one single nature of metal oxide from the first and second metal layers.

The contact areas generated at the bonding interface then comprise one single nature of metal oxide forming direct contact areas with the first metal layer and with the second metal layer, which allows for a better quality of the electrically conductive metal/oxide/metal contact.

According to one variant, the metal of the first metal layer is different from the metal of the second metal layer so that the oxidizing fluid generates a metal oxide which comprises two oxide natures. A first oxide nature is generated by the oxidation of the metal of the first metal layer and a second oxide nature is generated by the oxidation of the metal of the second metal layer. Thus, the contact areas are formed by the metal oxide comprising two oxide natures, which are in direct contact with each other, the first nature being also in direct contact respectively with the first metal layer and the second nature being in direct contact respectively with the second metal layer.

According to another arrangement, the application of the thermal budget according to step c) is carried out at a temperature comprised between 30° C. and 400° C. and preferably at a temperature lower than or equal to 250° C. and still preferably at a temperature comprised between 50° C. and 200° C., over a time period comprised between a few tens of minutes and several hours. These relatively low temperatures, in comparison with the temperatures of conventional thermo-compression, limit the degradation of components that may be present on the substrates.

According to one possible embodiment, the first metal layer completely covers said surface of the first substrate and the second metal layer completely covers said surface of the second substrate. Thus, the oxidizing fluid can circulate between the cavities that are present at the interface between the first and the second metal layers which completely cover said surfaces of the first and second substrates.

According to another variant, the first metal layer and the second metal layer respectively comprise a plurality of first metal pads between which a first insulating material extends and a plurality of second metal pads between which a second insulating material extends.

Preferably, the height of the first metal pads and the height of the second metal pads is, respectively, smaller than or equal to a thickness of the first insulating material and a thickness of the second insulating material.

This variant allows obtaining a structure comprising two substrates bonded by a conductive direct bonding comprising at least two conductive regions which are vertically insulated, at the first and second metal pads which are brought in contact.

By 'thickness' of the insulating material, it is meant in the present document, a distance between a surface on which the insulating material rests and a top surface of the insulating material.

Preferably, the height of the first metal pads is strictly smaller than the thickness of the first insulating material.

Advantageously, the height difference between the first metal pads and the thickness of the first insulating material is at most of two millimeters.

According to one possibility, the height of the second metal pads is strictly smaller than the thickness of the second insulating material.

Advantageously, the height difference between the second metal pads and the thickness of the second insulating material is at most of two millimeters. Advantageously, the first insulating material and/or the second insulating material is made of silicon oxide.

According to a second aspect, the invention proposes a structure presenting a vertical electrical conductivity and comprising a stack including successively:
a first substrate of a semi-conductive material,
a first metal layer,
a second metal layer directly bonded to the first metal layer by direct bonding so as to form an electrically conductive bonding interface, and
a second substrate of a semi-conductive material,
the bonding interface comprising:
metal material bridges between the first metal layer and the second metal layer, the metal material bridges being separated by cavities,
a metal oxide, generated by the oxidation of the portions of the first metal layer and second metal layer that delimit the cavities, filling at least in part the cavities, the metal oxide forming contact areas between the portions of the first metal layer and second metal layer that delimit the cavities.

Advantageously, at least 50% of the cavities, partially filled with the metal oxide, present a dimension smaller than or equal to 50 nanometers, preferably a dimension smaller than or equal to 25 nm, and still preferably a dimension smaller than or equal to 10 nm.

Preferably, the cavities, partially filled with the metal oxide, present a dimension smaller than or equal to 10 nanometers.

Thus, the mechanical resistance of the bonding interface is strengthened by the presence of contact areas with larger dimensions. Moreover, the electrical conductivity of this type of direct bonding according to the invention is improved in comparison with that obtained with a conventional direct bonding due to the presence of the metal oxide which may be conductive or semi-conductive.

According to one possibility, the first metal layer completely covers a surface of the first substrate and the second metal layer completely covers a surface of the second substrate.

According to one variant, the structure comprises a first insulating material and a second insulating material, the first metal layer and the second metal layer respectively comprise a plurality of first metal pads between which the first insulating material extends and a plurality of second metal pads between which the second insulating material extends.

Preferably, the height of the first metal pads and the height of the second metal pads is smaller than or equal to respectively a thickness of the first insulating material and a thickness of the second insulating material.

Thus, this structure presents a plurality of conductive regions at the first and second metal pads facing each other and sealed by direct bonding, which are vertically insulated between the metal pads.

Other aspects, aims and advantages of the present invention will appear better upon reading the following description of two embodiments thereof, given as non-limiting examples and with reference to the appended drawings. In order to improve their readability, the figures do not necessarily comply with the scale of all represented elements. For simplicity, in the following description, identical, similar or equivalent elements of the different embodiments carry the same reference numerals.

FIGS. 1 to 4 illustrate an embodiment of the method according to the invention.

FIG. 5 illustrates a structure prepared for a future application.

Figure 8:
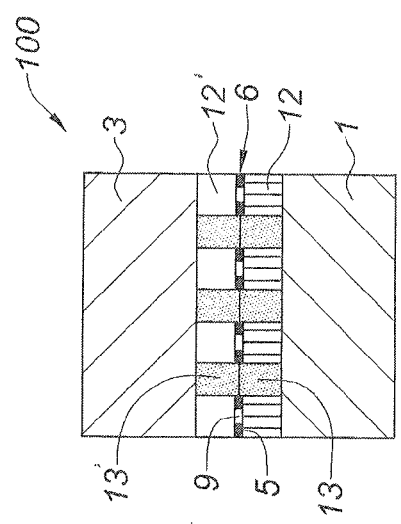
FIGS. 6 to 8 represent a second embodiment of the method illustrated in FIGS. 1 to 4.

FIG. 1 represents step a) of the method which consists in providing a first silicon substrate 1, on a surface of which a first copper metal layer 2 has been deposited, and a second silicon substrate 3, on a surface of which a second copper metal layer 4 has been deposited. In particular, the first metal layer 2 and the second metal layer 4 are deposited by CVD so as to completely cover said surfaces of the respective substrates 1, 3 by a deposit which is commonly called 'full-wafer'. According to an arrangement which is not illustrated, the surfaces of the substrates have been provided beforehand with a thermal silicon oxide layer and a barrier layer of 60 nanometers of TiN deposited by CVD (Chemical Vapor Deposition) so as to promote the mechanical strength of the metal layers 2, 4 on the substrates 1, 3. Afterwards, the first and second copper metal layers 2, 4 are deposited with a thickness comprised between 20 and 5000 nanometers directly on the barrier layer by the PVD method (Pressure Vapor Deposition).

The thus formed first and second metal layers 2, 4 present, for a thickness of 1 micrometer, a RMS roughness of about 5.6 nanometers (on a 20*20 micrometers field) and a hydrophily corresponding to a water drop angle of about 37°.

According to an arrangement which is not illustrated, the invention may be implemented with a first metal layer 2 and a second metal layer 4 comprising materials other than copper, such as molybdenum, tungsten and their alloys. Moreover, the metal of the first metal layer 2 may be different from the metal of the second metal layer 4.

FIG. 2 illustrates the contacting of the first and second copper metal layers 2, 4 according to step b) of the method carrying out a direct bonding between the surfaces presenting the aforementioned characteristics. This bonding allows generating copper/copper metal material bridges 5 at the bonding interface 6 between the first metal layer 2 and the second metal layer 4. These metal material bridges 5 are symbolically represented in FIG. 2 by black thick dashed lines at the bonding interface 6. The bonding interface 6 also comprises cavities (not illustrated) which separate the metal material bridges 5. These fluidly connected cavities result from defects or voids in the solid material which are formed during the direct bonding.

Then, as is illustrated in FIG. 3, the bonding may be strengthened by thermo-compression (steps c and c1). A thermal budget for annealing the bonding is carried out at 200° C. for 1 hour, while applying a pressure of about 1.91 MPa on either side of the bonding interface 6. Preferably, this pressure is applied over the entire surface of the bonded substrates by means of two pistons 11 with a force of 15 kN when the substrates present a diameter of about 10 cm. Thus, an evenly distributed homogenous pressure is exerted on either side of the bonding interface 6. This thermo-compression step may be carried out under primary or secondary vacuum.

The thermo-compression allows increasing the bonding energy between the first and second metal layers 2, 4. The Cu/Cu metal material bridges 5 are illustrated by thicker dashed lines at the bonding interface 6 symbolizing a bonding force which is more significant upon completion of steps c) and c1). The temperature of the thermal budget may vary depending on the properties of the substrates to be bonded, in particular in terms of roughness and hydrophily of the surfaces. For example, the temperature may be comprised between 30° C. and 400° C., and preferably the temperature is lower than or equal to 250° C. and still preferably the temperature is comprised between 50° C. and 200° C., over a time period comprised between a few tens of minutes and several hours. The applied pressure may also vary typically between 1 and 5 MPa.

This thermo-compression step illustrated in FIG. 3 is optional. If some conditions are met at the surfaces to be assembled, in particular in terms of RMS roughness (typically smaller than 0.7 nm) and of hydrophily, the simple contacting of the substrates may be sufficient to ensure their adhesion (the method then corresponds to the steps illustrated in FIGS. 1, 2 and 4). In this case, a preliminary step i) of surface preparation is generally necessary, in particular of smoothing which may be obtained by mechano-chemical polishing.

Finally, according to step d) of the method illustrated in FIG. 4, the bonding interface 6 is immersed in an oxidizing fluid 8, such as liquid water at 22° C., over a time period of about 12 hours. This immersion allows the propagation of the fluid 8 at the cavities over the entire bonding interface 6. This phase is fast (from 10 seconds to about one minute). It also causes over this time period the oxidation, at least in part, of the portions of the first metal layer 2 and of the second metal layer 4 which delimit the cavities, into copper oxide $Cu_2O$. This thus generated metal oxide allows filling, at least in part, the cavities. $Cu_2O$ presents indeed a volume that is more significant than the unoxidized copper so that the growth of the copper oxide phase at the surface of the cavities results in filling them. Thus, all defects are filled by the copper oxide. The bonding interface 6 obtained after oxidation comprises Cu/Cu metal material bridges 5, Cu/$Cu_2O$/Cu contact areas 9 (symbolized by gray thick lines 9 between black thick lines symbolizing the metal material bridges 5 in FIG. 4) as well as residual cavities the largest dimension of which is smaller than or equal to 10 nanometers. Such an interface 6, provided with metal metal material bridges 5 and contact areas 9 made of semi-conductive copper oxide, presents a strengthened bonding energy and an optimized vertical electrical conductivity, in comparison with a bonding interface 6 obtained by a conventional direct bonding.

In the variant where the first metal layer 2 is formed of a metal which is different from that of the second metal layer 4, the metal oxide may comprise two different oxide natures, depending on the oxidation kinetics of the two metals. The contact areas 9 are then formed of oxide of two different metals which connects portions of the first metal layer 2 and portions of the second metal layer 4. Thus, the bonding interface 6 is mechanically strengthened and the vertical electrical conductivity is improved depending on the conductivity of the two oxide natures.

Moreover, the oxidizing fluid 8 may be constituted by an oxidizing liquid of a nature other than water, such as an oxidizing gas, chosen according to the nature of the metal to be oxidized. Moreover, the oxidizing fluid 8 may be heated to a temperature comprised between about 10° C. and 100° C. during the immersion, so as to increase or decrease the rate of oxidation of the metal.

According to another possible embodiment not illustrated, subsequently to the immersion step d), it is possible to carry out a step e) of applying a heat treatment for strengthening the bonding, as with conventional direct bondings.

Thus, the method leads to the manufacture of a structure 100 including a stack comprising successively a first silicon substrate 1, a first Cu metal layer 2, a second Cu metal layer 4 directly bonded to the first metal layer 2 by direct bonding, so as to form an electrically conductive bonding interface 6, and a second silicon substrate 3. The bonding interface 6 comprises cavities filled at least in part by a copper oxide, Cu/Cu metal material bridges 5 and Cu/Copper oxide/copper contact areas 9. The residual cavities present a dimension at most of 10 nanometers. Due to the presence of the Cu/$Cu_2O$/Cu contact areas 9 at the bonding interface 6, it is possible to perform a mechanical thinning of the 'grinding' type or rectification from the exposed rear face of one of the substrates 1, 3 without causing detachment at the bonding interface 6 (in FIG. 5, the substrate 3 has been thinned resulting in the substrate 3').

Figure 7:
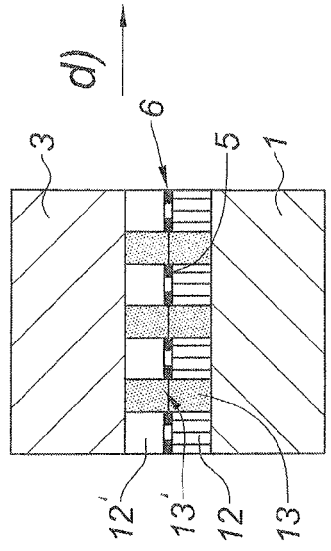
Figure 6:
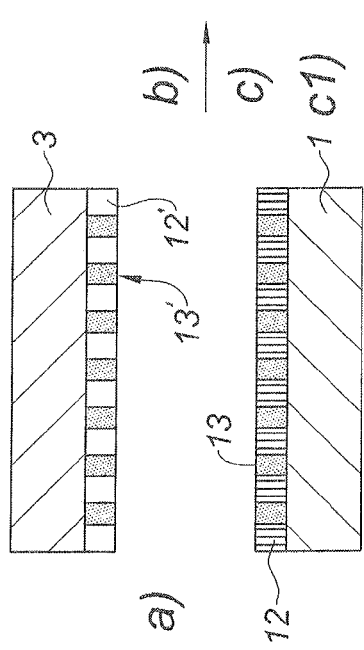

According to a second embodiment of the invention illustrated in FIGS. 6 to 8, the first and second metal layers 2, 4 are formed of at least two metal pads 12, 12' separated by an insulating material area 13, 13' thereby creating a bonding interface 6 comprising conductive areas and other electrically insulating areas between the metal pads 12, 12'. According to one possible embodiment, the first and second metal layers 2, 4 are deposited by CVD.

As is illustrated in FIG. 6, a first substrate 1 and a second substrate 3, for example made of silicon, are covered respectively with a first metal layer 2, comprising a plurality of first metal pads 12, for example made of copper, and a second metal layer 4 comprising a plurality of second metal pads 12', also made of copper (step a). First areas and second areas, respectively made of a first insulating material 13 and a second insulating material 13', respectively extend between the first metal pads 12 and between the second metal pads 12'. As is illustrated in FIG. 6, the height of the first metal pads 12 is substantially equal to the thickness of the first insulating material 13. Similarly, the height of the second metal pads 12' is substantially equal to the thickness of the second insulating material 13'.

In particular, the first insulating material 13 and the second insulating material 13' are made of an electrically insulating silicon oxide. Instead, other electrically insulating elements may also be used.

FIG. 7 illustrates the contacting of the first metal pads 12 and the second metal pads 12' according to step b) of the method, the first insulating material 13 and the second insulating material 13' being also brought into contact. The subsequent circulation of the oxidizing fluid 8 at the bonding interface 6 takes place at the cavities formed at the interface 6 of the first metal pads 12 and the second metal pads 12' facing each other. Then, a thermo-compression step is applied to the formed structure (steps c and c1) in order to strengthen the bonding energy by formation of Cu/Cu metal material bridges 5 separated by cavities which are fluidly connected to the bonding interface 6.

FIG. 8 illustrates the structure 100 obtained after the immersion of the interface 6 according to step d) of the method. This immersion leads to the oxidation of the copper portions that delimit the cavities so as to fill, at least in part, the cavities. Thus, thanks to the presence of the metal oxide forming contact areas 9, the bonding interface 6 presents a bonding energy which is improved and suitable for carrying out subsequent steps, in particular a mechanical thinning, according to the aimed applications. The obtained structure 100 presents a stack comprising successively a first Si substrate 1, a first metal layer 2 comprising a plurality of first metal pads 12 between which a first insulating material 13 extends such as a silicon oxide, a second metal layer 4 comprising a plurality of second metal pads 12' between which a second insulating material 13' extends, and a second Si substrate 3. The height of the first metal pads 12 and the height of the second metal pads 12' is substantially equal to respectively the thickness of the first insulating material 13 and the thickness of the second insulating material 13'. Once brought into contact, the first and second copper metal layers 2, 4 and the first and second insulating materials 13, 13' form a bonding interface 6 ensuring a vertical electrical conduction at the bonding of the facing metal pads 12, 12' and a vertical electrical insulation at the facing insulating materials 13, 13'. Of course, the bonding interface 6 comprises metal metal material bridges 5, cavities whose largest dimension is smaller than or equal to 10 nanometers and Cu/Cu oxide/Cu contact areas 9.

According to a possibility not illustrated, the height of the first metal pads 12 is smaller than the thickness of the first material 13. The maximum difference being 2 mm. Still according to another possibility, the height of the second metal pads 12' is smaller than the thickness of the second material 13' with a maximum difference of 2 mm. In these cases, the oxidizing fluid 8 also ensures the generation of a metal oxide which is sufficient for forming contact areas 9 between the portions of the first metal layer 2 and the portions of the second metal layer 4 which delimit the cavities at the bonding interface 6 (step d).

According to a variant not illustrated, the first substrate 1 comprises a semi-conductive material which is different from that of the second substrate 3 according to the present invention.

Thus, the present invention proposes a method for carrying out a conductive direct metal bonding between two semi-conductive substrates 1, 3 which allows limiting the planarization and hydrophily constraints of the surfaces to be bonded, while ensuring a strong bonding energy, a very good electrical conductivity and an inexpensive implementation.

It goes without saying that the invention is not limited to the variants described above as examples, but it encompasses all technical equivalents and variants of the described means as well as their combinations.

The invention claimed is:

1. A method for carrying out a conductive direct metal bonding between two substrates of semi-conductive materials, comprising the steps of:
   a) Providing a first substrate a surface of which is covered by a first metal layer, and a second substrate a surface of which is covered by a second metal layer,
   b) Bringing into direct contact the first metal layer and the second metal layer so as to form a bonding interface comprising metal material bridges between the first metal layer and the second metal layer, the metal material bridges being separated by cavities which are fluidly connected to each other,
   d) Immersing the bonding interface in an oxidizing fluid so as to oxidize, at least in part, portions of the first metal layer and portions of the second metal layer which delimit the cavities, this oxidation generating a metal oxide which fills, at least in part, the cavities, the metal oxide forming contact areas between the portions of the first metal layer and the second metal layer which delimit the cavities.

2. The method according to claim 1, wherein prior to step a) of providing a first substrate and a second substrate, the method comprises a step of depositing, by CVD (Chemical Vapor Deposition), the first metal layer and the second metal layer respectively on said surface of the first substrate and on said surface of the second substrate.

3. The method according to claim 1, wherein the immersion step d) is carried out over a time period comprised between about 30 minutes and several hours so as to enable the penetration of the oxidizing fluid and the growth of the metal oxide in the cavities.

4. The method according to claim 1, wherein between the steps b) and d), the method comprises a step c) of applying a thermal budget of bonding annealing.

5. The method according to claim 4, wherein the application of the thermal budget, according to step c), further comprises a step c1) of applying a pressure on either side of the bonding interface.

6. The method according to claim 1, wherein prior to the contacting step b), the method comprises a step consisting in smoothing the surfaces of the first metal layer and the second metal layer.

7. The method according to claim 1, wherein, the immersion step d) comprises heating the oxidizing fluid.

8. The method according to claim 1, wherein, subsequently to step d), the method comprises a step e) of applying a heat treatment for strengthening the bonding.

9. The method according to claim 1, wherein the oxidizing fluid comprises an oxidizing gas or an oxidizing liquid.

10. The method according to claim 1, wherein the metal of the first metal layer and the metal of the second metal layer are chosen among copper, molybdenum, tungsten and their alloys.

11. The method according to claim 1, wherein the metal of the first metal layer is identical to the metal of the second metal layer.

12. The method according to claim 4, wherein the application of the thermal budget according to step c) is carried out at a temperature comprised between 30° C. and 400° C., over a time period comprised between a few tens of minutes and several hours.

13. The method according to claim 1, wherein the first metal layer completely covers said surface of the first substrate and in that the second metal layer completely covers said surface of the second substrate.

14. The method according to claim 1, wherein the first metal layer and the second metal layer respectively comprise a plurality of first metal pads between which a first insulating material extends and a plurality of second metal pads between which a second insulating material extends, the height of the first metal pads and the height of the second metal pads being smaller than or equal to respectively a thickness of the first insulating material and a thickness of the second insulating material.

15. A structure presenting a vertical electrical conductivity and comprising a stack including successively:
   a first substrate of a semi-conductive material,
   a first metal layer,
   a second metal layer directly bonded to the first metal layer by direct bonding so as to form an electrically conductive bonding interface, and
   a second substrate of a semi-conductive material,
   the bonding interface comprising:
   metal material bridges between the first metal layer and the second metal layer, the metal material bridges being separated by cavities,
   a metal oxide, generated by immersion in an oxidizing fluid and the oxidation of the portions of the first metal layer and the second metal layer which delimit the cavities, filling at least in part the cavities, the metal oxide forming contact areas between the portions of the first metal layer and the second metal layer which delimit the cavities.

16. The structure according to claim 15, wherein at least 50% of the cavities, partially filled with the metal oxide, present a dimension smaller than or equal to 50 nanometers.

17. The structure according to claim 15, wherein the first metal layer completely covers a surface of the first substrate and in that the second metal layer completely covers a surface of the second substrate.

18. The structure according to claim 15, wherein the structure comprises a first insulating material and a second insulating material and in that the first metal layer and the second metal layer respectively comprise a plurality of first metal pads between which the first insulating material extends and a plurality of second metal pads between which the second insulating material extends, the height of the first metal pads and the height of the second metal pads being smaller than or equal to respectively a thickness of the first insulating material and a thickness of the second insulating material.

* * * * *